(12) United States Patent
Arisumi et al.

(10) Patent No.: US 9,240,494 B2
(45) Date of Patent: Jan. 19, 2016

(54) SEMICONDUCTOR DEVICE AND METHOD FOR FABRICATING SEMICONDUCTOR DEVICE

(71) Applicants: Osamu Arisumi, Mie (JP); Toshihiko Iinuma, Mie (JP)

(72) Inventors: Osamu Arisumi, Mie (JP); Toshihiko Iinuma, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 209 days.

(21) Appl. No.: 13/713,766

(22) Filed: Dec. 13, 2012

(65) Prior Publication Data

US 2014/0048863 A1 Feb. 20, 2014

Related U.S. Application Data

(60) Provisional application No. 61/683,547, filed on Aug. 15, 2012.

(51) Int. Cl.
| | |
|---|---|
| *H01L 29/788* | (2006.01) |
| *H01L 29/66* | (2006.01) |
| *H01L 21/28* | (2006.01) |
| *H01L 27/115* | (2006.01) |
| *H01L 29/423* | (2006.01) |

(52) U.S. Cl.
CPC ........ *H01L 29/788* (2013.01); *H01L 21/28273* (2013.01); *H01L 27/11521* (2013.01); *H01L 29/42336* (2013.01); *H01L 29/66825* (2013.01); *H01L 29/7881* (2013.01)

(58) Field of Classification Search
CPC ............... H01L 21/28273; H01L 27/11521; H01L 29/42336; H01L 29/66825; H01L 29/788; H01L 29/7881
See application file for complete search history.

(56) References Cited

U.S. PATENT DOCUMENTS

| | | | |
|---|---|---|---|
| 7,514,338 B2 | 4/2009 | Arisumi et al. | |
| 7,618,876 B2 | 11/2009 | Arisumi et al. | |
| 2004/0119110 A1* | 6/2004 | Park | 257/315 |
| 2004/0238881 A1* | 12/2004 | Ozawa | 257/316 |
| 2006/0270170 A1 | 11/2006 | Arisumi et al. | |
| 2007/0166951 A1 | 7/2007 | Arisumi et al. | |
| 2010/0055869 A1 | 3/2010 | Arisumi et al. | |
| 2011/0291174 A1 | 12/2011 | Ooike et al. | |
| 2012/0187467 A1* | 7/2012 | Rogers et al. | 257/315 |

FOREIGN PATENT DOCUMENTS

| | | |
|---|---|---|
| JP | 2006-332442 | 12/2006 |
| JP | 2007-194286 | 8/2007 |
| JP | 2008-124517 | 5/2008 |
| JP | 2011-66052 | 3/2011 |
| JP | 2011-253881 | 12/2011 |

* cited by examiner

*Primary Examiner* — Daniel Whalen
(74) *Attorney, Agent, or Firm* — Oblon, McClelland, Maier & Neustadt, L.L.P.

(57) ABSTRACT

A semiconductor device including a first dielectric film, a floating gate portion, second and third dielectric films, a control gate portion, and a recess on the side face of the floating gate portion. The second dielectric film for element isolation is embedded between a height position of a lower portion of the side face of the floating gate portion and a height position inside the semiconductor substrate. The third dielectric film covers an upper surface and a side face portion of the floating gate portion up to a height position of an upper surface of the second dielectric film, and on the second dielectric film. A height position of an interface between the second and third dielectric films is between a height position of a center of the recess and a position in a predetermined range below the height position of the center of the recess.

9 Claims, 21 Drawing Sheets

|  | $CF_4$ | $CF_4$, $O_2$, $N_2$ |
|---|---|---|
| Line Width | 21.5/21.7 | 22.0/22.4 |
| FG Taper Angle | 88.9/88.9 | 87.5/87.9 |
| Offset Amount | 1.4/1.6 | 1.0/1.0 |

FIG. 5

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from U.S. Patent Application No. 61/683,547 filed on Aug. 15, 2012 in U.S.A., the entire contents of which are incorporated herein by reference.

FIELD

Embodiments described herein relate generally to a semiconductor device and a method for fabricating a semiconductor device.

BACKGROUND

In development of a semiconductor device, particularly a semiconductor storage apparatus, memory cells are made increasingly finer to achieve a larger capacity, lower cost and the like. In a semiconductor storage apparatus mounted with a floating gate structure of a NAND flash memory device, for example, a wiring pitch between word lines to be a control gate in a gate portion is made ever finer. Such a finer structure of LSI is actively promoted for the purpose of achieving performance improvement such as faster operations of device and lower power consumption due to higher integration and curbing fabricating costs. In recent years, flash memories whose minimum processing dimension is about, for example, 20 nm are fabricated at a mass production level and still finer structures are expected to be developed, increasing technical difficulty. To realize a high-quality and high-performance semiconductor device in the face of such structures that are becoming rapidly finer, it becomes necessary to reduce variations of the threshold voltage of each memory cell or to reduce degradation of write properties or leak properties. For that purpose, for example, the height of interface between a dielectric film and an interpoly dielectric film (IPD) embedded in an device isolation region between memory cells is desirably uniform and flat in each space between memory cells.

However, a dielectric film is conventionally etched back after the dielectric film being deposited in the device isolation region between memory cells and the amount of etch-back between memory cells varies due to deteriorated accuracy of processing caused by finer structures and varied embedded film structures. Thus, interpoly dielectric films (IPD) are formed on dielectric films whose height varies, leading to non-uniform heights of interface between the dielectric film and interpoly dielectric film among spaces between memory cells. As a result, problems of threshold variations and degraded electric properties such as an increased write voltage or leak current become more evident from generation to generation.

BRIEF DESCRIPTION OF THE DRAWINGS

FIG. 5 is a diagram showing an example of results of measuring the bowing shapes when the etching gas according to the first embodiment and the etching gas according to the comparative example are used;

DETAILED DESCRIPTION

A semiconductor device according to an embodiment, includes a first dielectric film, a floating gate portion, a second dielectric film, a third dielectric film, and a control gate portion. A first dielectric film is formed above a semiconductor substrate. A floating gate portion is formed above the first dielectric film, a recess cutting into an inner portion of a side face of the floating gate portion being formed on the side face of the floating gate portion. A second dielectric film for element isolation of semiconductor elements is arranged on a side of the side face of the floating gate portion and embedded between a height position of a lower portion of the side face of the floating gate portion and a height position inside the semiconductor substrate. A third dielectric film is formed to cover an upper surface of the floating gate portion and a side face portion of the floating gate portion up to a height position of an upper surface of the second dielectric film, of the side face of the floating gate portion continuing from the upper surface of the floating gate portion, and also on the second dielectric film. A control gate portion is formed above the third dielectric film. A height position of an interface between the second dielectric film and the third dielectric film is provided between a height position of a center of the recess and a position in a predetermined range below the height position of the center of the recess.

First Embodiment

In the first embodiment below, a configuration in which an n-type semiconductor film is inserted at some midpoint of a floating gate film (charge storage layer) using a p-type semiconductor film will be described. Also in the first embodiment, the method for fabricating a nonvolatile NAND flash memory device as an example of the semiconductor device will be described. Incidentally, the method for fabricating a semiconductor device described below is not limited to the NAND flash memory device and is also effective for other floating gate semiconductor devices in which a plurality of gate structures is aligned. The first embodiment will be described below by using the drawings.

Figure 1:
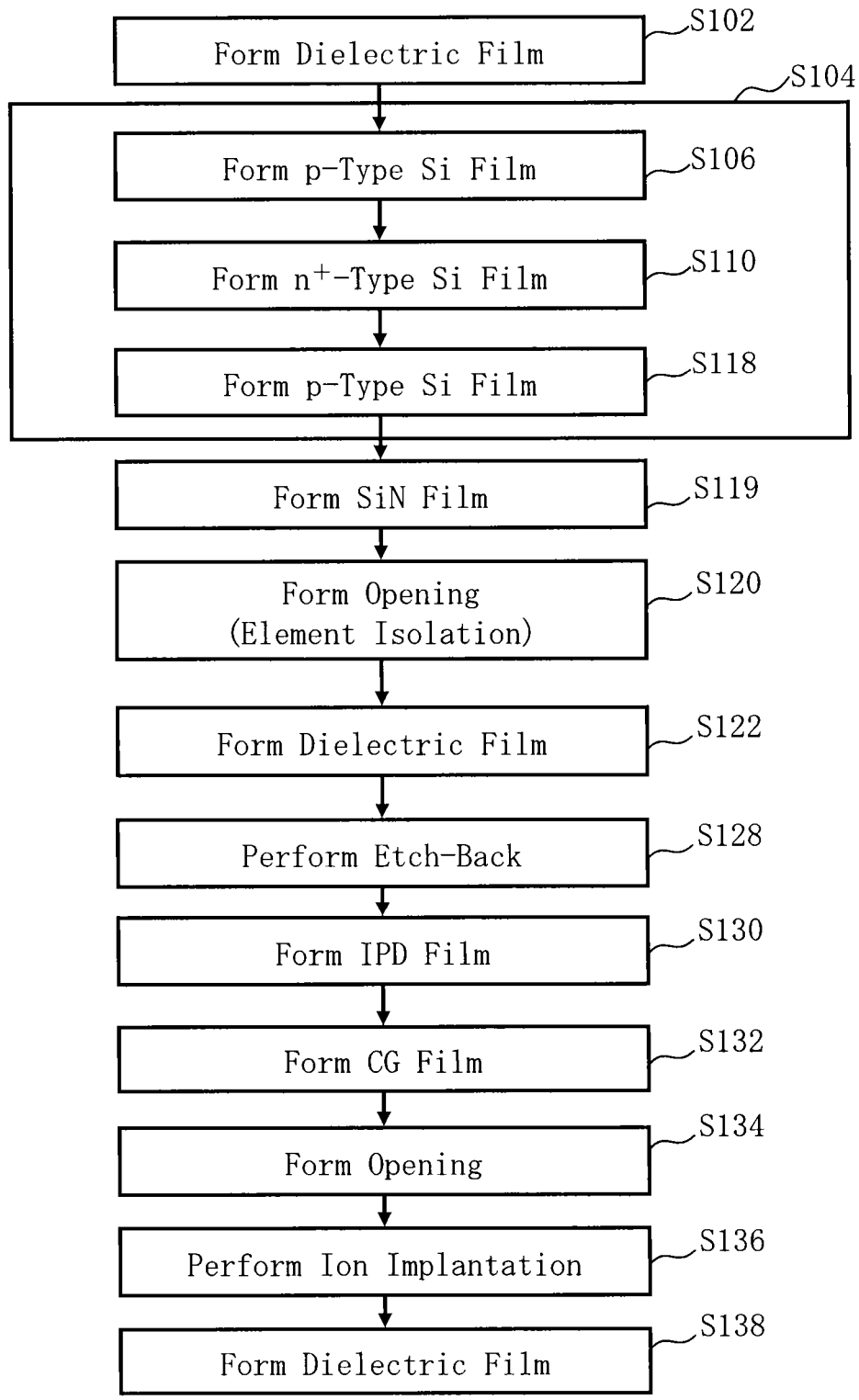
FIG. 1 is a flowchart showing principal part processes of a method for fabricating a semiconductor device according to a first embodiment.

FIG. 1 is a flowchart showing principal part processes of a method for fabricating a semiconductor device according to a first embodiment. In FIG. 1, the method for fabricating a semiconductor device according to the first embodiment executes a series of processes including a dielectric film formation process (S102), a semiconductor film formation process for a floating gate (FG) (S104), a silicon nitride (SiN) film formation process (S119), an opening formation process (S120), a dielectric film formation process (S122), an etch-back process (S128), an interpoly dielectric film (IPD film) formation process (S130), a control gate (CG) film formation process (S132), an opening formation process (S134), an ion implantation process (S136), and a dielectric film formation process (S138). The semiconductor film formation process for a floating gate (FG) (S104) executes a series of a p-type silicon (Si) film formation process (S106), an n⁺-type Si film formation process (S110), and a p-type Si film formation process (S118) as its internal processes.

FIGS. 2A to 2D show process sectional views of the method for fabricating a semiconductor device according to the first embodiment. FIGS. 2A to 2D show the dielectric film formation process (S102) to the p-type Si film formation process (S118) in FIG. 1. Subsequent processes will be described later.

Figure 2A:
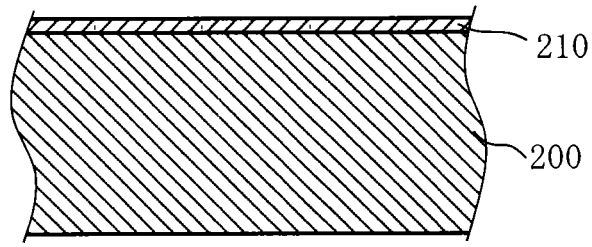
FIGS. 2A to 2D are process sectional views of the method for fabricating a semiconductor device according to the first embodiment.

In FIG. 2A, as the dielectric film formation process (S102), a dielectric film 210 (first dielectric film) is formed on a semiconductor substrate 200 to a thickness of, for example, 2 to 20 nm. The dielectric film 210 functions as a tunnel dielectric film (gate dielectric film). The dielectric film 210 is suitably formed by, for example, heating treatment (thermal oxidation treatment) in an oxygen atmosphere. For example, a silicon oxide ($SiO_2$) film is used as the dielectric film 210. For example, a p-type silicon substrate made of a silicon wafer of 300 mm in diameter is used as the semiconductor substrate 200.

Next, as the semiconductor film formation process for FG (S104), a semiconductor film for a floating gate is formed on the dielectric film 210. The internal processes of the semiconductor film formation process for FG (S104) will be described below.

Figure 2B:
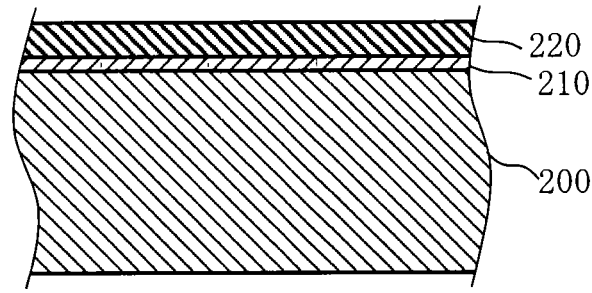

In FIG. 2B, as the p-type Si film formation process (S106), a p-type polysilicon film 220 (first Si film) doped with boron (B) is formed on the dielectric film 210 by using, for example, the low-pressure chemical vapor deposition (LP-CVD) method to a thickness of, for example, 20 to 30 nm. The polysilicon film 220 functions as a charge storage layer (floating gate: FG) portion integrally with polysilicon films 222 and 224 described later. As the method for forming the polysilicon film 220, after a polysilicon film not doped with impurities being deposited to a thickness of, for example, 20 to 30 nm, boron (B) may be introduced in a subsequent process by the vapor doping method, ion implantation method or the like.

Figure 2C:
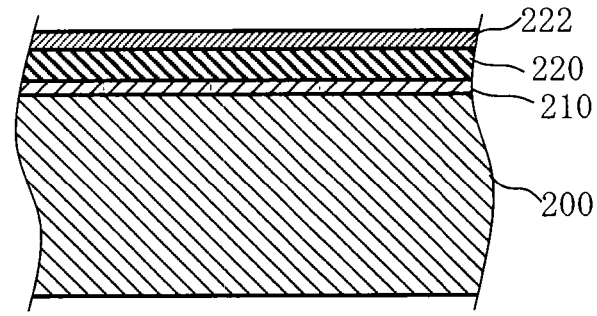

In FIG. 2C, as the n⁺-type Si film formation process (S110), an n⁺-type polysilicon film 222 (second Si film) doped with high-concentration phosphorus (P) is formed on the polysilicon film 220 by using, for example, the LP-CVD method to a thickness of, for example, 5 nm. The concentration of P in the polysilicon film 222 is suitably set to, for example, 3 to $4 \times 10^{20}$ cm⁻³. As the method for forming the polysilicon film 222, after a polysilicon film not doped with impurities being deposited to a thickness of, for example, 5 nm, high-concentration P may be introduced in a subsequent process by the vapor doping method, ion implantation method or the like.

Figure 2D:
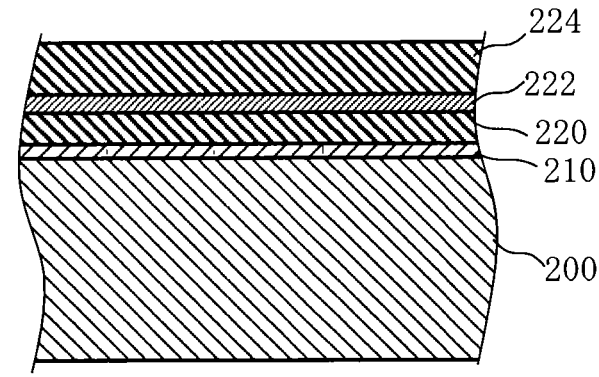

In FIG. 2D, as the p-type Si film formation process (S118), a p-type polysilicon film 224 (third Si film) doped with B is formed on the polysilicon film 222 by using, for example, the LP-CVD method to a thickness of, for example, 20 to 30 nm. The polysilicon film 224 functions as a charge storage layer (floating gate: FG) integrally with the polysilicon films 220 and 222. As the method for forming the polysilicon film 224, after a polysilicon film not doped with impurities being deposited to a thickness of, for example, 20 to 30 nm, boron (B) may be introduced in a subsequent process by the vapor doping method, ion implantation method or the like.

The semiconductor film for FG is formed, as described above, by the thin n⁺-type polysilicon film 222 being sandwiched between the p-type polysilicon films 220 and 224.

Figure 3A:
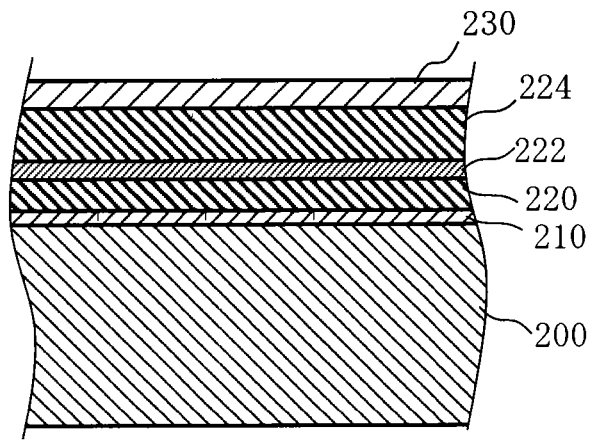
FIGS. 3A to 3C are process sectional views of the method for fabricating a semiconductor device according to the first embodiment.
Figure 3B:
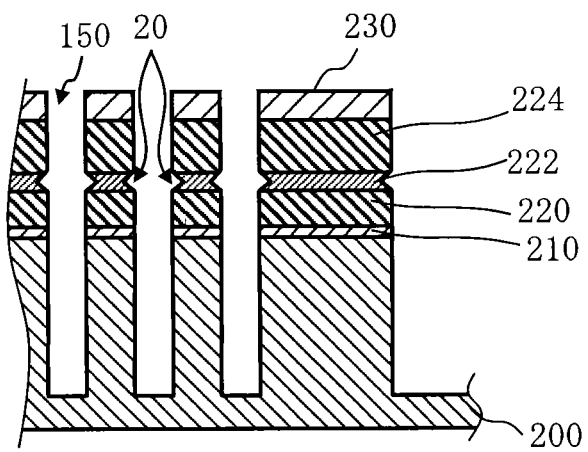
Figure 3C:
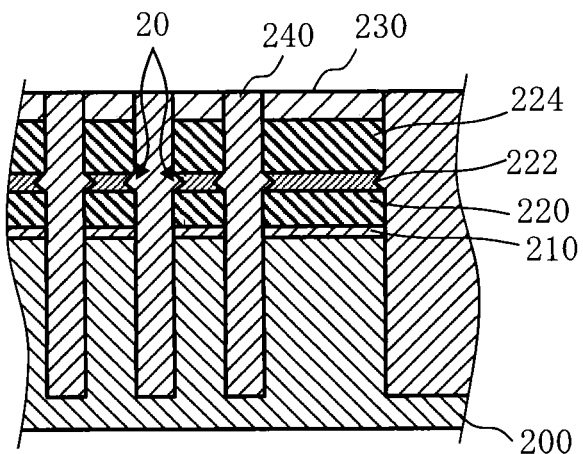

FIGS. 3A to 3C show process sectional views of the method for fabricating a semiconductor device according to the first embodiment. FIGS. 3A to 3C show the SiN film formation process (S119) to the dielectric film formation process (S122) in FIG. 1. Subsequent processes will be described later. FIGS. 3A to 3C show sections in a direction along the longitudinal direction of a control gate (CG) (word line).

In FIG. 3A, as the SiN film formation process (S119), a silicon nitride (SiN) film 230 is formed on the polysilicon film 224 by using, for example, the CVD method to a thickness of, for example, 30 nm. The SiN film 230 functions as a CMP (chemical mechanical polishing) stopper in a planarization process described later.

In FIG. 3B, as the opening formation process (S120), an opening 150 in a groove shape is formed from the SiN film 230 up to some midpoint of the semiconductor substrate 200. For example, the opening 150 of the width 20 nm or less is formed at intervals of 40 nm or less. The opening 150 can be formed substantially perpendicularly to the surface of the semiconductor substrate 200 by removing the exposed SiN film 230 and the polysilicon films 224, 222, 220, the dielectric film 210, and the semiconductor substrate 200 positioned as lower layers of the SiN film 230 by the anisotropic etching method from the semiconductor substrate 200 having a mask film formed on the SiN film 230 by undergoing a sidewall transfer processing process (not shown). For example, the opening 150 may be formed, as an example, by the reactive ion etching (RIE) method. The opening 150 formed as described above becomes an element isolation region.

When the opening 150 is formed, according to the first embodiment, etching is performed by using a halogen containing gas as an etching gas without an additional gas such as nitrogen ($N_2$) and oxygen ($O_2$) being added thereto. Incidentally, a $CF_4$ gas, $C_4F_8$ gas, $CHF_3$ gas, or $CH_2F_2$ gas is suitably used as the halogen containing gas. By performing etching using a halogen containing gas to which no additional gas is added, a recess 20 in a wedge shape cutting into the inner portion from the side face is formed on the side face in a height position of the polysilicon film 222 in a semiconductor film for FG configured by the polysilicon films 220, 222 and 224.

Figure 4A:
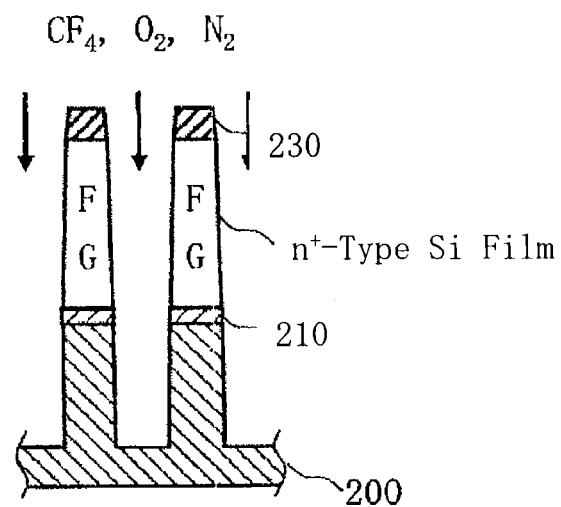
FIGS. 4A and 4B are conceptual diagrams comparing bowing shapes when an etching gas according to the first embodiment and an etching gas according to a comparative example are used.
Figure 4B:
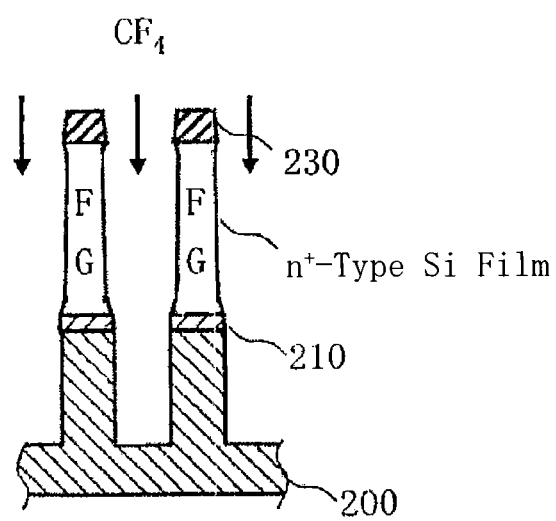

FIGS. 4A and 4B are conceptual diagrams comparing bowing shapes when an etching gas according to the first embodiment and an etching gas according to a comparative example are used. When an $n^+$-type polysilicon film is etched by using a $CF_4$ gas to which an additional gas like $N_2$ or $O_2$ is added, as shown in FIG. 4A, the $n^+$-type polysilicon film to be an FG film is etched substantially perpendicularly. In contrast, when an $n^+$-type polysilicon film is etched by using a $CF_4$ gas to which no additional gas like $N_2$ or $O_2$ is added, as shown in FIG. 4B, the $n^+$-type polysilicon film to be an FG film is etched more actively, making it more difficult to maintain the width of the film.

FIG. 5 is a diagram showing an example of results of measuring the bowing shapes when the etching gas according to the first embodiment and the etching gas according to the comparative example are used. FIG. 5 shows the line width, FG taper angle, and offset amount. Also, measurements of an FG film formed in the center of a substrate and measurements of an FG film formed in an outer circumferential portion of the substrate are each made. FIG. 5 shows that while an $n^+$-type polysilicon film has a line width of 22.0 nm in the center of the substrate and 22.4 nm in the outer circumferential portion of the substrate when the $n^+$-type polysilicon film formed as an FG film is etched by using an $CF_4$ gas to which an additional gas like $N_2$ or $O_2$ is added, the line width becomes thinner like 21.5 nm in the center of the substrate and 21.7 nm in the outer circumferential portion of the substrate when an $n^+$-type polysilicon film is etched by using a $CF_4$ gas to which no additional gas is added. FIG. 5 also shows that while the taper angle of an $n^+$-type polysilicon film is 87.5° in the center of the substrate and 87.9° in the outer circumferential portion of the substrate when the $n^+$-type polysilicon film is etched by using an $CF_4$ gas to which an additional gas like $N_2$ or $O_2$ is added, the taper angle of an $n^+$-type polysilicon film becomes larger like 88.9° in the center of the substrate and 88.9° in the outer circumferential portion of the substrate for thinning of a lower portion of the FG film when the $n^+$-type polysilicon film is etched by using a $CF_4$ gas to which no additional gas is added. FIG. 5 also shows that while the offset amount of an $n^+$-type polysilicon film is 1.0 in the center of the substrate and 1.0 in the outer circumferential portion of the substrate when the $n^+$-type polysilicon film is etched by using an $CF_4$ gas to which an additional gas like $N_2$ or $O_2$ is added, the offset amount of an $n^+$-type polysilicon film becomes larger like 1.4 in the center of the substrate and 1.6 in the outer circumferential portion of the substrate when the $n^+$-type polysilicon film is etched by using a $CF_4$ gas to which no additional gas is added. It is clear from the above that it is easier to etch an $n^+$-type polysilicon film when a $CF_4$ gas to which no additional gas is added is used than when a $CF_4$ gas to which an additional gas like $N_2$ or $O_2$ is added is used.

Though not shown, it is easier to side-etch an $n^+$-type polysilicon film than a p-type polysilicon film even if anisotropic RIE technology is applied. This is because the $n^+$-type polysilicon film is in an excessive state of electrons and isotropy manifests itself when such free electrons attract halogen elements with high electronegativity to contribute to an etching reaction of a sidewall surface. In the first embodiment, by inserting the thin $n^+$-type polysilicon film 222 between laminated films of the polysilicon films 220 and 224 using such an action, more side-etching is caused through the $n^+$-type polysilicon film 222 than the p-type polysilicon films 220 and 224. Accordingly, when the opening 150 for element isolation is formed in a semiconductor film for FG, the recess 20 cutting into the inner portion from the side face can be formed on the side face of the semiconductor film for FG in the height position of the polysilicon 222. Therefore, the height position in which the recess 20 is formed can be controlled to a desired height position by adjusting the height position of the polysilicon film 222.

A case when etching is performed by using a halogen containing gas to which no additional gas is added is shown in the above example, but the present embodiment is not limited to such an example. When, in addition to the above halogen containing gas, a hydrogen boride (HBr) gas is added in a proportion exceeding the halogen containing gas, a similar effect can be achieved by adding an additional gas like $N_2$ or $O_2$.

In FIG. 3C, as the dielectric film formation process (S122), a dielectric film 240 (second dielectric film) is deposited in the opening 150 so as to bury the opening 150 and on the SiN film 230 by using, for example, the chemical vapor deposition (CVD) method or the coating process. When the dielectric film 240 is deposited in the opening 150, the opening 150 is filled with the dielectric film 240 so as to be deposited into the inner portion of the semiconductor film from the side face of the semiconductor film in a height position at some midpoint of the semiconductor film for FG. In other words, when the dielectric film 240 is deposited in the opening 150, the recess 20 formed on the side face of the semiconductor film for FG is also filled with the dielectric film 240.

Then, as a planarization process, the dielectric film 240 bulging out of the opening 150 and the dielectric film 240 on the SiN film 230 are polished and removed by the CMP method for planarization using the SiN film 230 as a stopper. Accordingly, as shown in FIG. 3C, the dielectric film 240 for element isolation between memory cells is formed. For example, an $SiO_2$ film is used as the dielectric film 240.

Figure 6A:
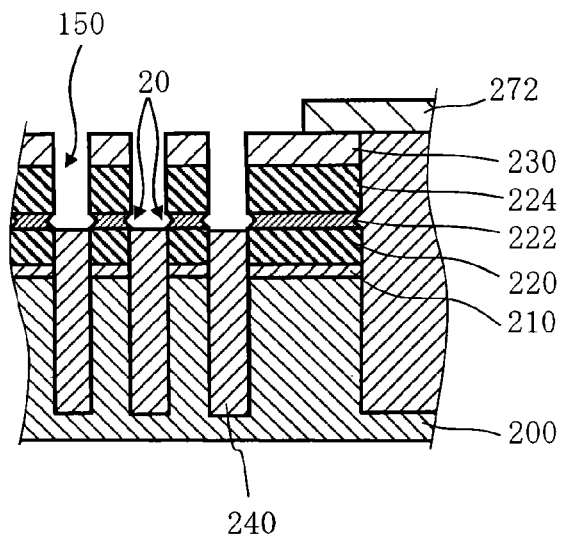
FIGS. 6A and 6B are process sectional views of the method for fabricating a semiconductor device according to the first embodiment.
Figure 6B:
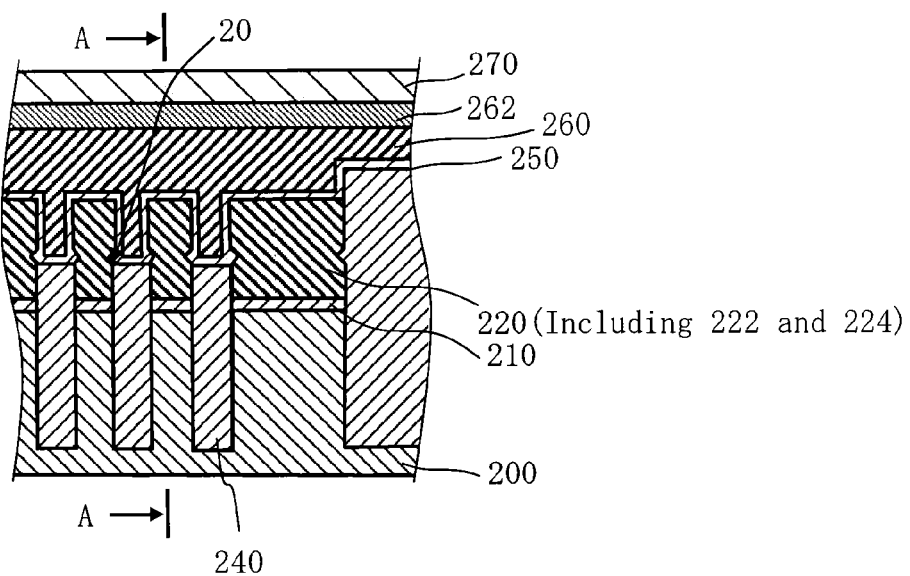

FIGS. 6A and 6B show process sectional views of the method for fabricating a semiconductor device according to the first embodiment. FIGS. 6A and 6B show the etch-back process (S128) to the CG film formation process (S132) in FIG. 1. Subsequent processes will be described later.

In FIG. 6A, as the etch-back process (S128), the dielectric film 240 is etched up to the position where the dielectric film 240 is deposited into and from the side face of the semiconductor film for FG by the etch-back method. Here, the surface of the dielectric film 240 for element isolation in the memory cell formation region is dug by using photolithography technology, RIE technology and the like to expose the side face of the polysilicon film 224 for FG. The resist film 272 may be left outside the memory cell formation region so as not to etch the dielectric film 240 for element isolation.

Figure 7A:
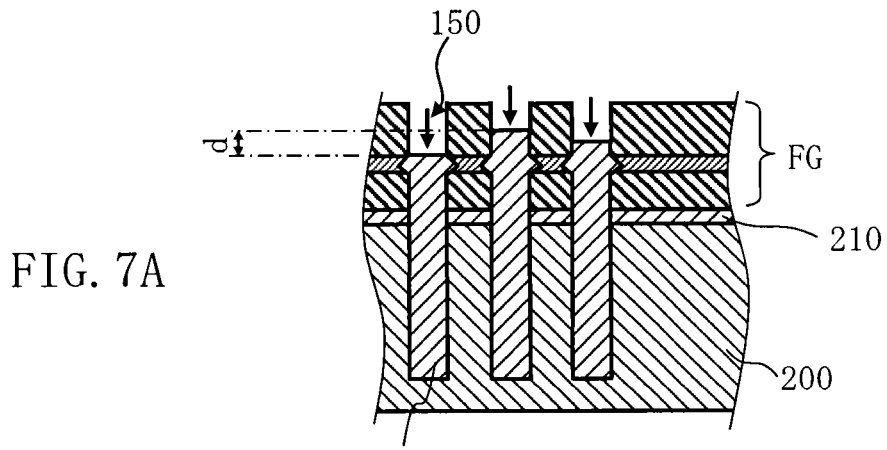
FIGS. 7A and 7B are conceptual diagrams illustrating an etch-back course according to the first embodiment.
Figure 7B:
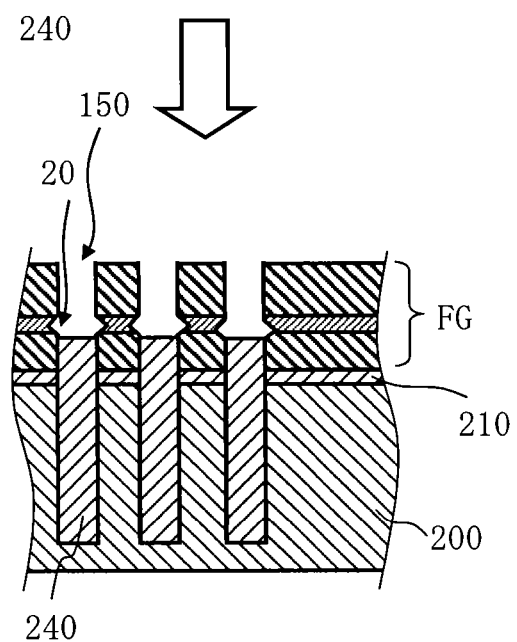

FIGS. 7A and 7B are conceptual diagrams illustrating an etch-back course according to the first embodiment. The dielectric film 240 burying a plurality of the openings 150 formed in each space between FG films for element isolation is etched from above by etch-pack processing like the down flow etching method. However, as shown in FIG. 7A, variations of the etching rate of the dielectric film 240 are present for each space between FG films due to variations in quality of the dielectric film 240 and variations in width of the opening 150. For example, a difference of a height d is maximally generated. In the first embodiment, the recess 20 is formed in the height position of the polysilicon film 222 and the dielectric film 240 is caused to deposit in the recess 20. When the dielectric film 240 for element isolation is dug, if the etch-back surface of the dielectric film 240 does not reach the recess 20, an etching gas entering the opening 150 is consumed on the surface of the dielectric film 240 only in the film thickness direction. On the other hand, if digging proceeds and the etch-back surface reaches the recess 20, the etching gas is also consumed for the dielectric film 240 buried in the recess 20 and a phenomenon in which the etching rate in the film thickness direction (height direction) extremely slows down occurs. This becomes more apparent with increasing denseness of film quality of the dielectric film 240 buried in the recess 20. In this case, as shown in FIG. 7A, variations of etching of the dielectric film 240 for element isolation in the adjacent openings 150 occur and even if a distribution of digging height is caused, the digging height is adjusted in a way in which an etching surface that has reached the height position of the recess 20 waits for another etching surface of the opening 150 that has not reached the height position of the recess 20. Thus, the width of the distribution of digging height is significantly reduced. As a result, as shown in FIG. 7B, a uniform and flat etching surface can be realized by such adjustments. The resist film 272 and the SiN film 230 that are left may be removed by etching.

Figure 8:
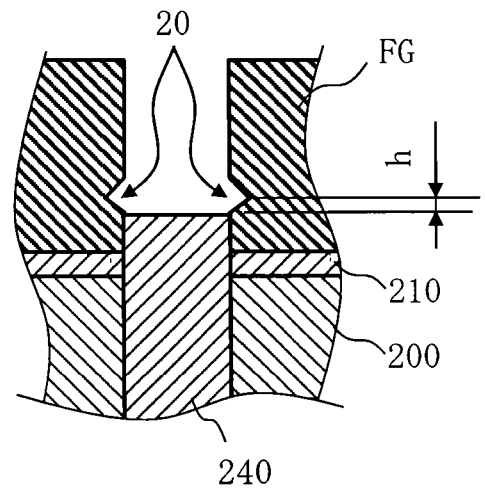
FIG. 8 is a sectional view showing the height position of the surface of a dielectric film for device isolation according to the first embodiment.

FIG. 8 is a sectional view showing the height position of the surface of a dielectric film for element isolation according to the first embodiment. The height position of the surface of the dielectric film 240 in each space between FG films after the etch-back process (S128) can be controlled to, as shown in FIG. 8, between the height position of the center of the recess 20 and the position a dimension h (for example, 5 to 8 nm) below from the height of the center of the recess 20 by the etch-back process (S128).

The dielectric film 240 is arranged, as described above, on the side face side of the FG portion and embedded between the height position of a side face lower portion of the FG portion and the height position inside the semiconductor substrate 200 for element isolation (shallow trench isolation structure: STI) of semiconductor devices.

In FIG. 6B, as the IPD film formation process (S130), an inter poly dielectric (IPD) film 250 (third dielectric film) is formed on the upper surface of the semiconductor film for FG, a side face portion of the semiconductor film for FG up to the height position of the surface of the dielectric film 240 of the side face of the semiconductor film for FG continuing from the upper surface, and the dielectric film 240 by using, for example, the CVD method to a thickness of, for example, 2 to 20 nm. The IPD film 250 functions as an inter-electrode dielectric film. In this case, the IPD film 250 may also be formed along the recess 20. Accordingly, an effective contact area of the polysilicon films 220, 222 and 224 to be a floating gate electrode and the IPD film 250 is increased so that write properties can be improved with an increased electric capacity.

The IPD film 250 is formed, as described above, to cover the upper surface of the FG portion and a side face portion of the FG portion up to the height position of the surface of the dielectric film 240 of the side face of the FG portion continuing from the upper surface and also on the dielectric film portion 240.

Next, as the CG film formation process (S132), a polysilicon film 260 is formed on the IPD film 250 by using, for example, the CVD method to a thickness of, for example, 50 nm or less. The polysilicon film 260 functions as part of the control gate (CG). Then, as an opening formation process of a select gate portion, an opening is formed in the polysilicon film 260 and the IPD dielectric film 250 of a select gate electrode portion or a gate electrode portion (not shown) of a peripheral transistor by using photolithography technology, RIE technology or the like. Then, as a tungsten (W) film formation process, a W film 262 is formed on the polysilicon film 260 in which an opening is formed by using, for example, the CVD method to a thickness of, for example, 30 nm or less. The W film 262 functions as part of the remaining control gate (CG). That is, the control gate has a laminated structure (control gate portion) in which the polysilicon film 260 and the W film 262 are stacked. A laminated film of the polysilicon film 260 and the W film 262 functions as a word line of a memory device.

A laminated film of the polysilicon film 260 and the W film 262 is used as a control gate here, but the control gate is not limited to such an example. Instead of the W film 262, a laminated film of a W film and tungsten nitride (WN) may be used. Alternatively, the W film 262 alone or a laminated film of a W film and tungsten nitride (WN) may be used as a control gate without using the polysilicon film 260. Alternatively, a laminated film of the W film 262 and another conductive film may be adopted as a control gate.

As a cap film formation process, a cap film 270 is formed on the W film 262 by using, for example, the CVD method to a thickness of, for example, 20 nm or less. An SiN film or the like is suitable as the cap film 270.

Figure 9A:
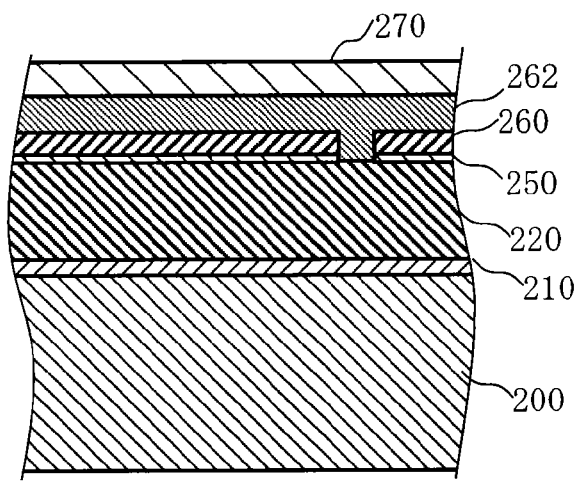
FIGS. 9A and 9B are process sectional views of the method for fabricating a semiconductor device according to the first embodiment.
Figure 9B:
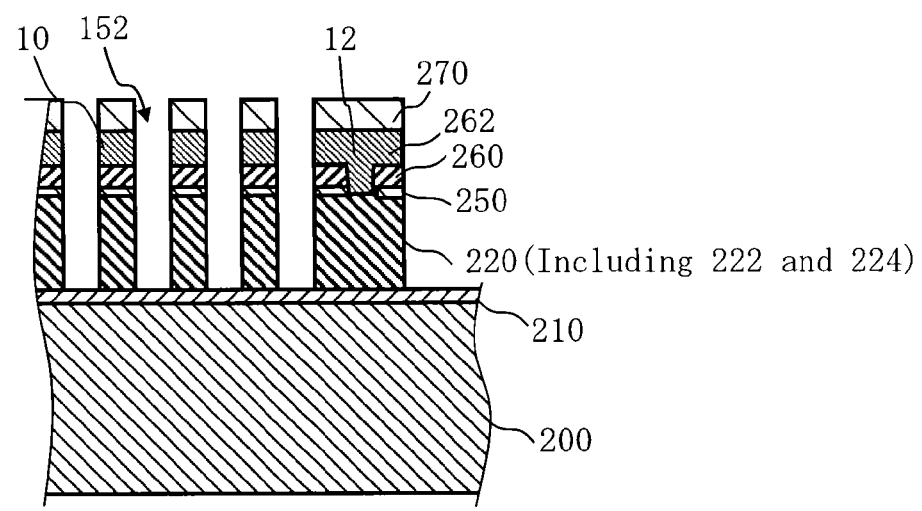

FIGS. 9A and 9B show process sectional views of the method for fabricating a semiconductor device according to the first embodiment. FIGS. 9A and 9B show the CG film formation process (S132) and the opening formation process (S134) in FIG. 1. Subsequent processes will be described later. FIGS. 9A and 9B show sections (A-A arrowed section in FIG. 6B) along a direction perpendicular to the longitudinal direction of the control gate (CG) (word line).

FIG. 9A shows a section along a direction perpendicular to the longitudinal direction of the control gate (CG) (word line) after the above CG film formation process (S132) is executed.

In FIG. 9B, as the opening formation process (S134), an opening 152 as a gate pattern groove structure is formed on both sides of a gate structure portion by a lithography process and a dry etching process (both are not shown) inside the cap film 270, the W film 262, the polysilicon film 260, the IPD dielectric film 250, and the polysilicon film 220. The p-type polysilicon films 220 and 224 and the polysilicon film 222 therebetween are integrated after internal diffusion of impurities by heating treatment caused in a subsequent process or the like. The FG film after the integration is shown here as the polysilicon film 220.

For example, the opening 152 of the width 20 nm or less is formed at intervals of 40 nm or less. As a result, a 1:1 gate pattern in which a gate structure 10 portion and the opening 152 each have a width dimension of, for example, 20 nm can be formed. The opening 152 can be formed substantially perpendicularly to the surface of the semiconductor substrate 200 by removing the exposed cap film 270 and the W film 262, the polysilicon film 260, the IPD dielectric film 250, and the polysilicon film 220 positioned as lower layers of the cap film 270 by the anisotropic etching method from the semiconductor substrate 200 having a mask film formed on the cap film 270 by undergoing a sidewall transfer processing process (not shown). For example, the opening 152 may be formed, as an example, by the reactive ion etching (RIE) method. Accordingly, each laminated film of the W film 262, the polysilicon film 260, the IPD dielectric film 250, and the polysilicon film 220 aligned along the longitudinal direction of the element isolation region via the opening 152 becomes the gate structure 10 portion of each cell of a NAND flash memory device. On the other hand, the control gate made of a laminated structure of the polysilicon film 260 and the W film 262 is shared by the gate structures 10 aligned in the longitudinal direction of the CG (word line) and functions as a word line of a NAND flash memory device. A select gate structure 12 is formed at an end of a plurality of gate structure 10 portions aligned in the longitudinal direction of the element isolation (STI structure) region.

Figure 10:
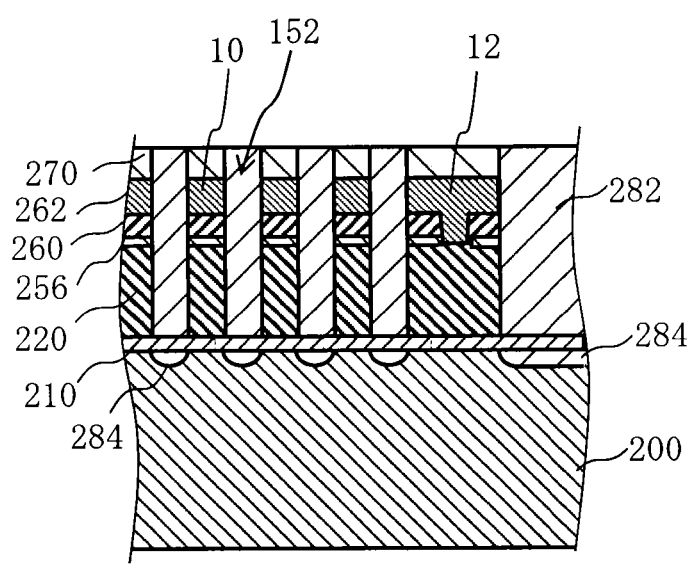
FIG. 10 is a process sectional view of the method for fabricating a semiconductor device according to the first embodiment.

FIG. 10 shows a process sectional view of the method for fabricating a semiconductor device according to the first embodiment. FIG. 10 shows the ion implantation process (S136) and the dielectric film formation process (S138) in FIG. 1. FIG. 10 shows a section along a direction perpendicular to the longitudinal direction of the control gate (CG) (word line).

First, as the ion implantation process (S136) after the opening formation process (S134), an n-type semiconductor region 284 is formed in a region on both sides of the gate structure 10 and the select gate structure 12 portion on the surface of the p-type semiconductor substrate 200 by ion implantation of n-type impurities. The n-type semiconductor region 284 functions as a source/drain region (S·D). A p-type semiconductor region sandwiched between the n-type semiconductor regions 284 functions as a channel region in which a gate region (G) is formed in an upper portion thereof. A NAND string structure in which a plurality of cells (gate structures 10) wherein a source portion of one of adjacent cells and a drain portion of the other cell are shared is aligned is formed.

In FIG. 10, as the dielectric film formation process (S138), a semiconductor device shown in FIG. 10 can be formed by filling the opening 152 with a dielectric film 282 by using, for example, the CVD method. In this case, it is also suitable to form the dielectric film 282 covering an upper portion of the opening 152 so that the space between the gate structures 10 becomes a cavity.

When forming the IPD dielectric film 250 described above, it is difficult to conformally form the depth side of the recess 20 as well and thus, even if the side-etch amount in the recess 20 varies when the dielectric film 240 for element isolation is etched, the difference of entrap amounts of the IPD dielectric film 250 decreases and as a result, the effective capacitor area of each cell region becomes equivalent.

According to the first embodiment, as described above, the height of the interface between the dielectric film 240 and the IPD film 250 buried in the element isolation region between memory cells can be made uniform and flat for each space between memory cells. Therefore, the problem of variations of the effective capacitor area of the cell region that increase with increasingly finer structures can be solved by providing the recess 20 on the side face of an FG electrode and not only electric write properties and reliability are significantly improved, but also flexibility with which cell structures are designed is increased, making production and management in mass production quite easy.

Second Embodiment

While the $n^+$-type polysilicon film 222 is formed by being sandwiched between the p-type polysilicon films 220 and 224 in the first embodiment, a configuration in which the $n^+$-type polysilicon film 222 is formed by being sandwiched between upper and lower oxide films is described in a second embodiment. The second embodiment will be described below by using the drawings.

Figure 11:
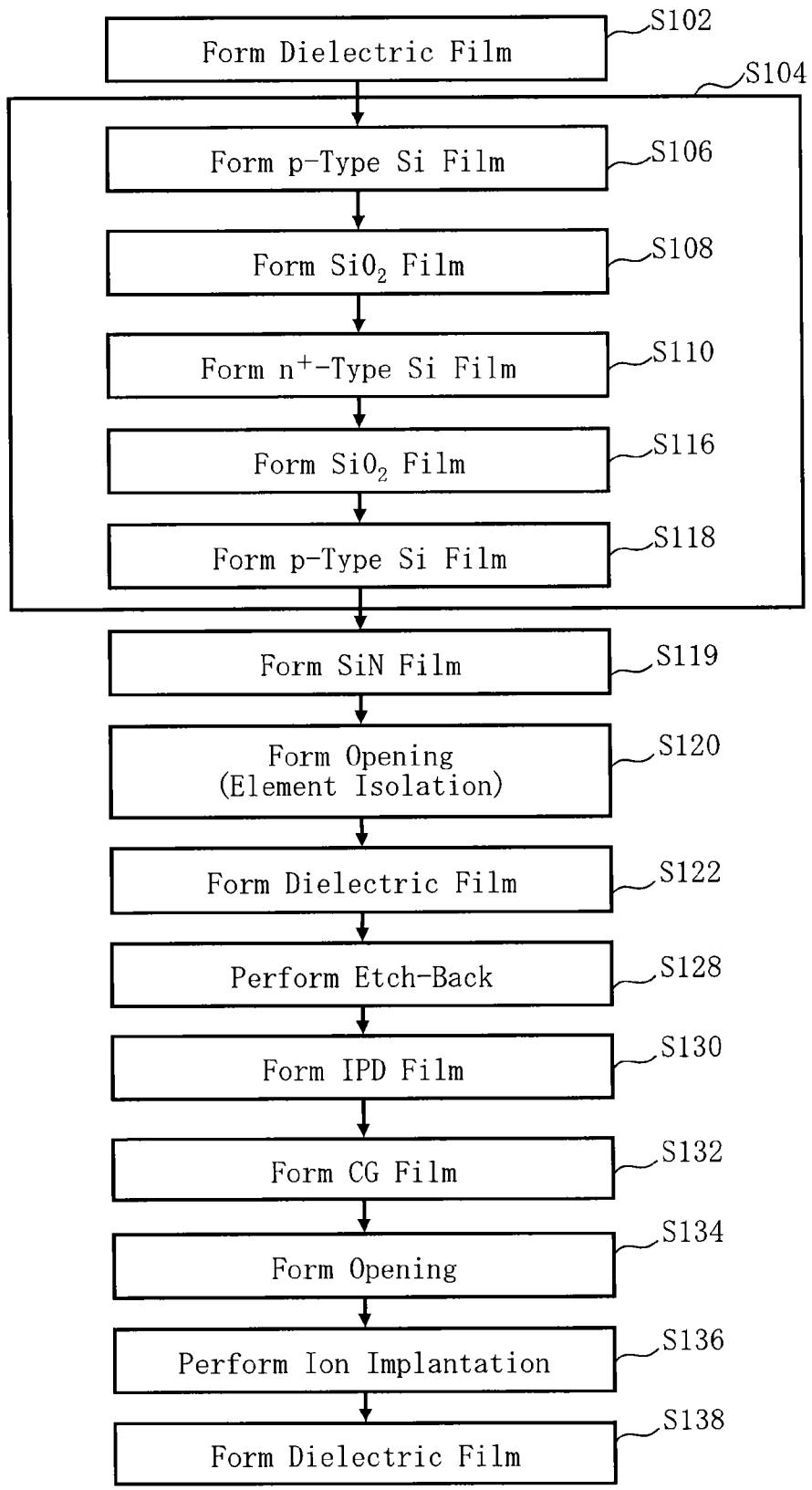
FIG. 11 is a flowchart showing principal part processes of the method for fabricating a semiconductor device according to a second embodiment.

FIG. 11 is a flowchart showing principal part processes of the method for fabricating a semiconductor device according to the second embodiment. FIG. 11 is the same as FIG. 1 except that an $SiO_2$ film formation process (S108) is added between the p-type silicon (Si) film formation process (S106) and the $n^+$-type Si film formation process (S110) and an $SiO_2$ film formation process (S116) is added between the $n^+$-type Si film formation process (S110) and the p-type Si film formation process (S118). Content other than content specifically described below is the same as in the first embodiment. First, the dielectric film formation process (S102) to the p-type silicon (Si) film formation process (S106) are the same as in FIG. 1.

Figure 12A:
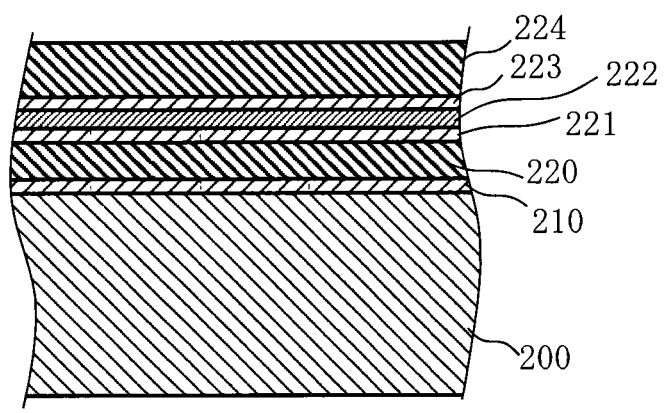
FIGS. 12A and 12B are process sectional views of the method for fabricating a semiconductor device according to the second embodiment.
Figure 12B:
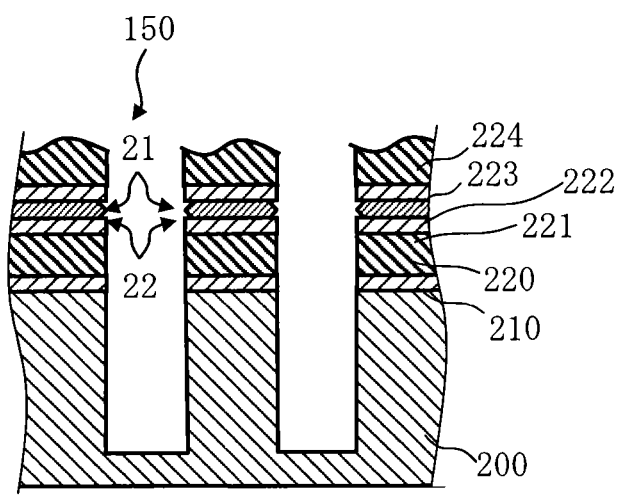

FIGS. 12A and 12B show process sectional views of the method for fabricating a semiconductor device according to the second embodiment. FIGS. 12A and 12B show the $SiO_2$ film formation process (S108) to the opening formation process (S120) in FIG. 11. Subsequent processes will be described later.

In FIG. 12A, as the $SiO_2$ film formation process (S108), an $SiO_2$ film 221 (first oxide film) is formed on the p-type polysilicon film 220 by using, for example, the CVD method or the atomic layer deposition (ALD) method to a thickness of, for example, 1 nm or less.

Then, as the $n^+$-type Si film formation process (S110), the $n^+$-type polysilicon film 222 is formed on the $SiO_2$ film 221.

Next, as the $SiO_2$ film formation process (S116), an $SiO_2$ film 223 (second oxide film) is formed on the $n^+$-type polysilicon film 222 by using, for example, the CVD method or the ALD method to a thickness of, for example, 1 nm or less.

Then, as the p-type Si film formation process (S118), the p-type polysilicon film 224 is formed on the $SiO_2$ film 223.

According to the above process, the $n^+$-type polysilicon film 222 can be formed so as to be sandwiched via the $SiO_2$ films 221 and 223 (oxide film portions) without being directly sandwiched between the p-type polysilicon films 220 and 224. Accordingly, an effect of suppressing mixing of p-type impurities and $n^+$-type impurities in a heating process before a recess is formed on the side face of a semiconductor film for FG can be expected. Also, electric conductivity in the FG film can be maintained by making the $SiO_2$ films 221 and 223 thinner. Therefore, the thickness of the $SiO_2$ films 221 and 223 may be set to a range in which electric conductivity in the FG film can be maintained.

Then, like in the first embodiment, as shown in FIG. 12B, 2-step recesses 21 and 22 having different heights can be formed on the side face of a FG film by executing the SiN film formation process (S119) and the opening formation process (S120). In the second embodiment, the $n^+$-type polysilicon film 222 more likely to be etched by a halogen containing gas to which no additional gas is added is sandwiched between the $SiO_2$ films 221 and 223. In such a case, etching in the opening formation process (S120) proceeds along the interface between the polysilicon film 222 and the $SiO_2$ film 221 and the interface between the polysilicon film 222 and the SiO$_2$ film 223 and thus, as shown in FIG. 12B, a plurality (here, for example, two steps) of the recesses 21 and 22 is formed from the side face toward the inner portion in the height position of the polysilicon film 222.

Figure 13:
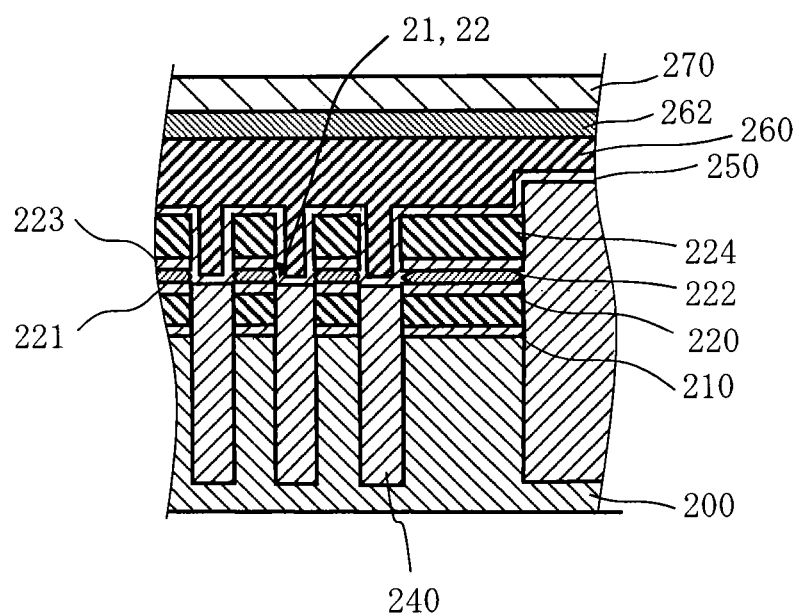
FIG. 13 is a process sectional view of the method for fabricating a semiconductor device according to the second embodiment.

FIG. 13 shows a process sectional view of the method for fabricating a semiconductor device according to the second embodiment. By executing the dielectric film formation process (S122) to the CG film formation process (S132) like in the first embodiment, as shown in FIG. 13, the height of the interface between the dielectric film 240 and the IPD dielectric film 250 can be aligned close to at least one of the 2-step recesses 21 and 22 having different heights for each space between memory devices. Incidentally, p-type impurities of the p-type polysilicon films 220 and 224, and n$^+$-type impurities of the n$^+$-type polysilicon film 222 are designed to be mixed in a subsequent heating process to have p-type conductivity in the end in the whole FG film.

Third Embodiment

In the first and second embodiments, the n$^+$-type polysilicon film 222 is formed by being sandwiched between the p-type polysilicon films 220 and 224, but the method for forming a recess on the side face of an FG film is not limited to such an example. In a third embodiment, a configuration in which a p$^+$-type polysilicon film is sandwiched between the p-type polysilicon films 220 and 224 will be described. The third embodiment will be described below by using the drawings.

Figure 14:
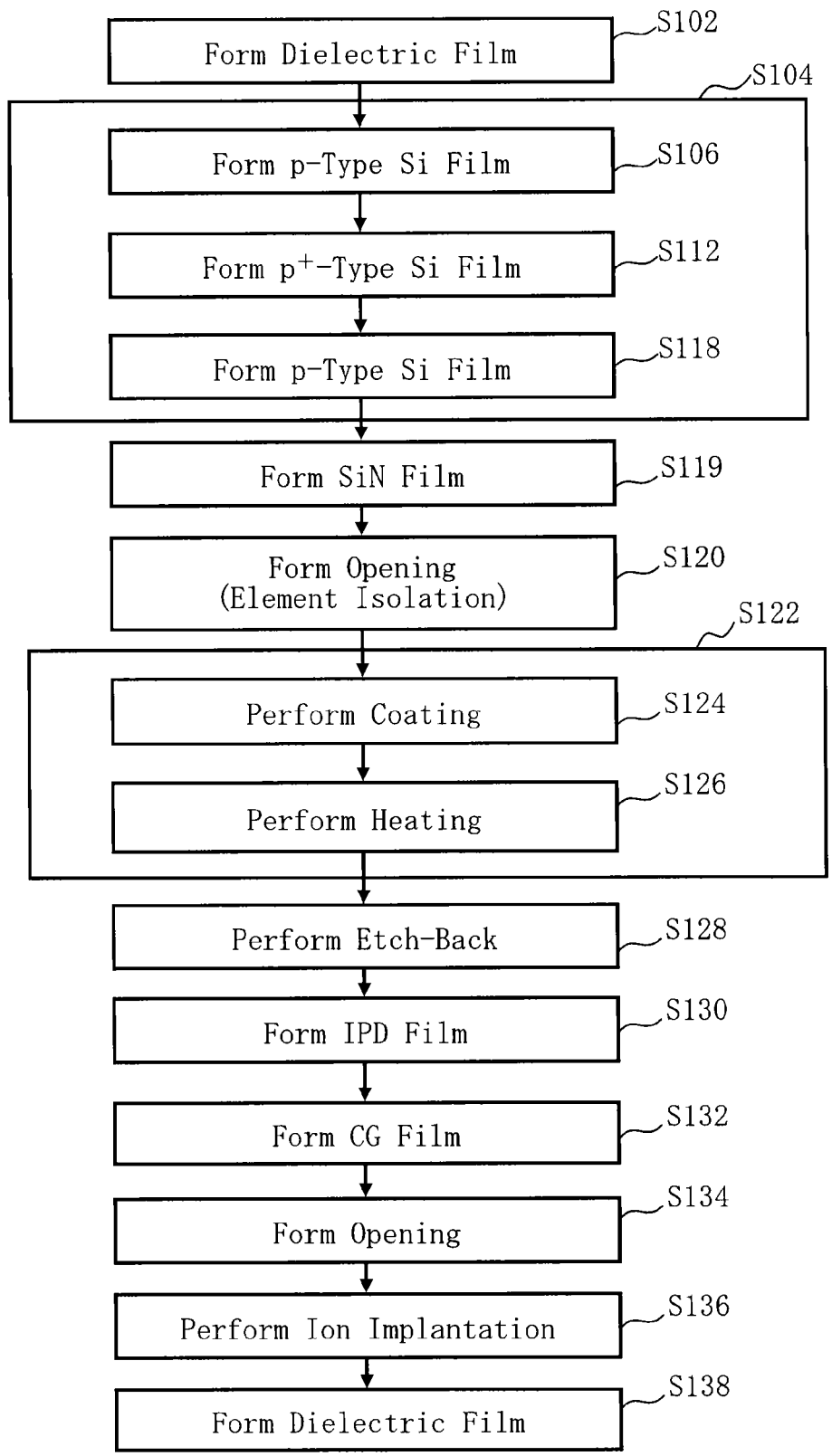
FIG. 14 is a flowchart showing principal part processes of the method for fabricating a semiconductor device according to a third embodiment.

FIG. 14 is a flowchart showing principal part processes of the method for fabricating a semiconductor device according to a third embodiment. FIG. 14 is the same as FIG. 1 except that a p$^+$-type Si film formation process (S112) is executed instead of the n$^+$-type Si film formation process (S110) and a coating process (S124) and a heating process (S126) are executed as internal processes of the dielectric film formation process (S122). Content other than content specifically described below is the same as in the first embodiment. First, the dielectric film formation process (S102) to the p-type silicon (Si) film formation process (S106) are the same as in FIG. 1.

Figure 15A:
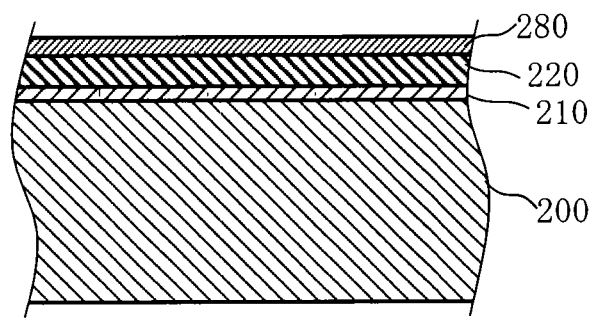
FIGS. 15A to 15C are process sectional views of the method for fabricating a semiconductor device according to the third embodiment.
Figure 15B:
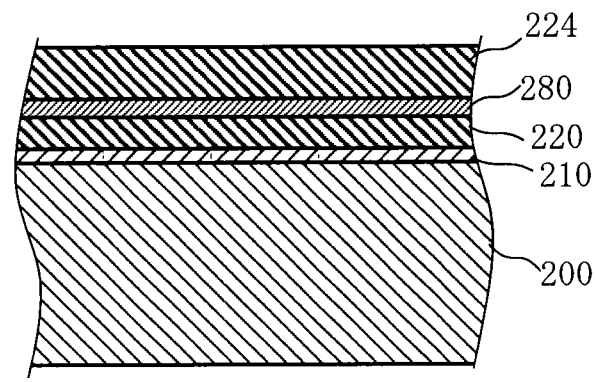
Figure 15C:
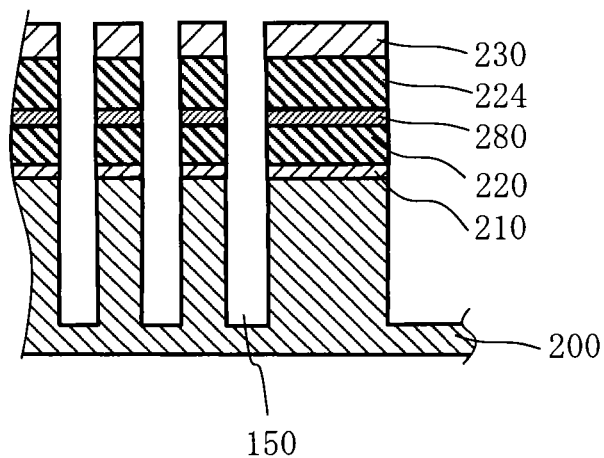

FIGS. 15A to 15C show process sectional views of the method for fabricating a semiconductor device according to the third embodiment. FIGS. 15A to 15C show the p$^+$-type Si film formation process (S112) to the opening formation process (S120) in FIG. 14. Subsequent processes will be described later.

In FIG. 15A, as the p$^+$-type Si film formation process (S112), a p$^+$-type polysilicon film 280 in a relatively high concentration is formed on the p-type polysilicon film 220 in a relatively low concentration by using, for example, the CVD method to a thickness of, for example, 5 nm.

In FIG. 15B, as the p-type Si film formation process (S118), the p-type polysilicon film 224 in a relatively low concentration is formed on the pt-type polysilicon film 280.

In FIG. 15C, like in the first embodiment, the SiN film formation process (S119) is first executed.

Next, as the opening formation process (S120), the opening 150 in a groove shape is formed from the SiN film 230 up to some midpoint of the semiconductor substrate 200. For example, the opening 150 of the width 20 nm or less is formed at intervals of 40 nm or less. The opening 150 can be formed substantially perpendicularly to the surface of the semiconductor substrate 200 by removing the exposed SiN film 230 and the polysilicon films 224, 280 and 220, the dielectric film 210, and the semiconductor substrate 200 positioned as lower layers of the SiN film 230 by the anisotropic etching method from the semiconductor substrate 200 having a mask film formed on the SiN film 230 by undergoing a sidewall transfer processing process (not shown). For example, the opening 150 may be formed, as an example, by the reactive ion etching (RIE) method. The opening 150 formed as described above becomes an element isolation region.

When the opening 150 is formed, etching is performed by using a halogen containing gas without any additional gas as an etching gas in the first embodiment, but the etching gas is not limited to such an example in the second embodiment because the n$^+$-type polysilicon film 222 is not formed. A halogen containing gas to which an additional gas such as N$_2$ or O$_2$ is added may be used to perform etching. Incidentally, a CF$_4$ gas, C$_4$F$_8$ gas, CHF$_3$ gas, or CH$_2$F$_2$ gas is suitably used as the halogen containing gas. In the second embodiment, as shown in FIG. 15C, no recess is formed on the side face of an FG film in the stage of the opening formation process (S120).

Figure 16A:
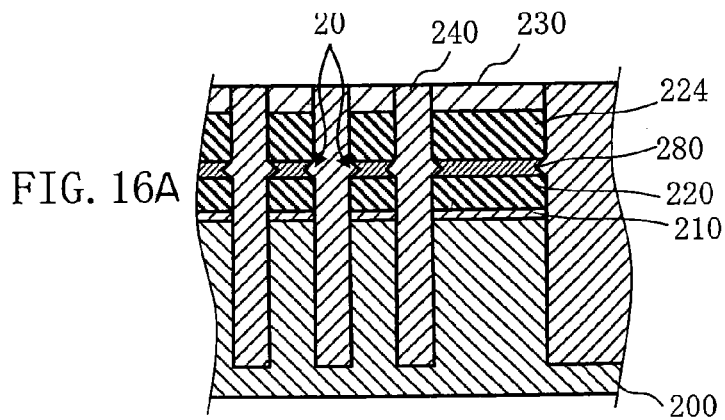
FIGS. 16A to 16C are process sectional views of the method for fabricating a semiconductor device according to the third embodiment.
Figure 16B:
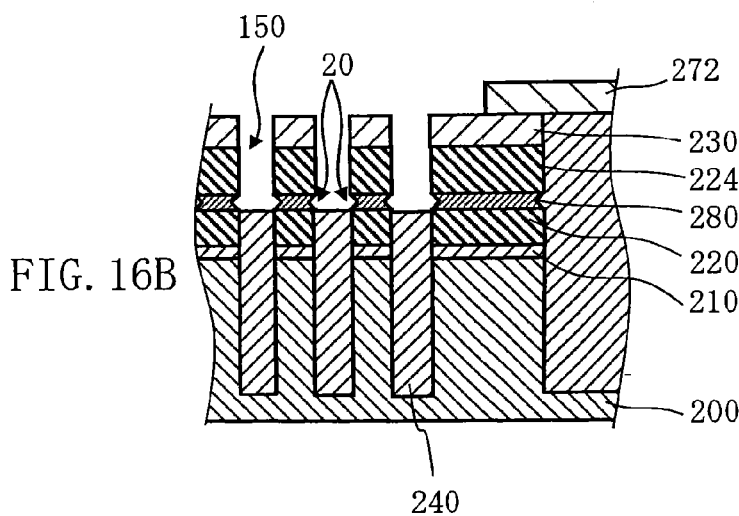
Figure 16C:
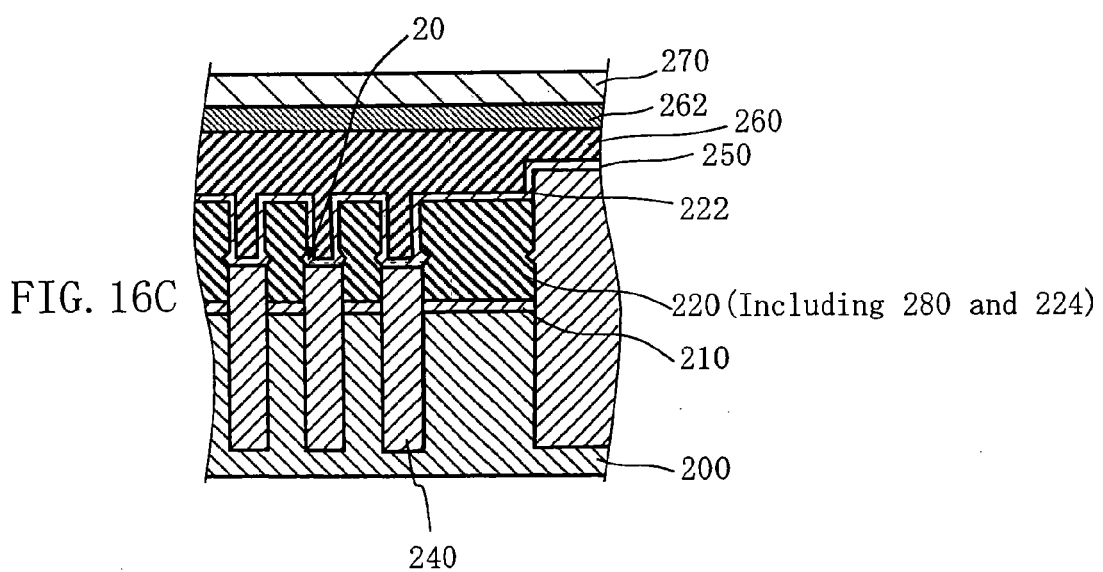

FIGS. 16A to 16C show process sectional views of the method for fabricating a semiconductor device according to the third embodiment. FIGS. 16A to 16C show the coating process (S124) to the CG film formation process (S132) in FIG. 14.

In FIG. 16A, as the coating process (S124), the dielectric film 240 (second dielectric film) is formed in the opening 150 so as to bury the opening 150 and on the SiN film 230 by using the coating method or the like. Like in the first embodiment, an SiO$_2$ film is suitably used as the dielectric film 240.

Then, as the heating process (S126), the coated dielectric film 240 is heated. For example, the dielectric film 240 is heated in a steam atmosphere by using the steam oxidation method. Alternatively, the dielectric film 240 may be heated in an N$_2$ atmosphere by using the N$_2$ annealing method. In a semiconductor film for FG configured by the polysilicon films 220, 280 and 224, accelerated oxidation is caused in the p$^+$-type polysilicon film 280 under the influence of moisture in the dielectric film 240 as a coated film in the height position of the p$^+$-type polysilicon film 280 and the recess 20 in a wedge shape cutting into the inner portion from the side face is formed on the side face thereof and like the dielectric film 240, an SiO$_2$ is formed also inside the recess 20.

Therefore, the state after the heating process (S126) can be made similar to the state after the dielectric film formation process (S122) in the first embodiment.

In FIG. 16B, when the etch-back surface reaches the recess 20 by executing the etch-back process (S128), an etching gas is also consumed for the dielectric film 240 buried in the recess 20 so that a phenomenon in which the etching rate in the thickness direction (height direction) is significantly decreased occurs. As a result, like in the first embodiment, adjustments are made in a way in which an etching surface that has reached the height position of the recess 20 waits for another etching surface of the opening 150 that has not reached the height position of the recess 20. Thus, the width of the distribution of digging height is significantly reduced. As a result, as shown in FIG. 7B, a uniform and flat etching surface can be realized by such adjustments.

By executing the IPD film formation process (S130) and the CG film formation process (S132) like in the first embodiment, as shown in FIG. 16C, the height of the interface between the dielectric film 240 and the IPD dielectric film 250 can be aligned close to the height of the recess 20 for each space between memory devices.

Fourth Embodiment

While the pt-type polysilicon film 280 is formed by being sandwiched between the p-type polysilicon films 220 and 224 in the third embodiment, a configuration in which the p+-type polysilicon film 280 is formed by being sandwiched between upper and lower oxide films is described in a fourth embodiment. The fourth embodiment will be described below by using the drawings.

Figure 17:
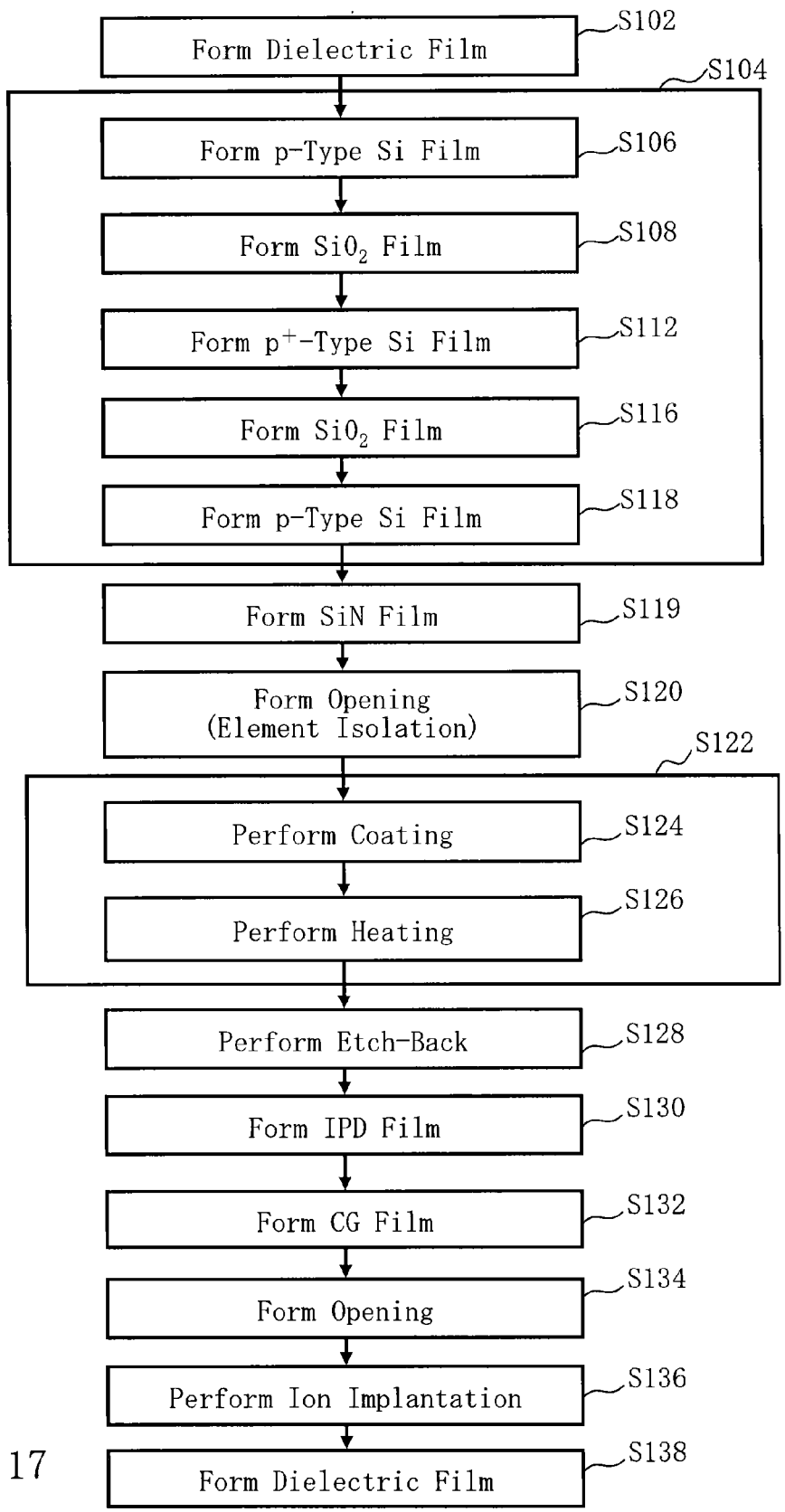
FIG. 17 is a flowchart showing principal part processes of the method for fabricating a semiconductor device according to a fourth embodiment.

FIG. 17 is a flowchart showing principal part processes of the method for fabricating a semiconductor device according to the fourth embodiment. FIG. 17 is the same as FIG. 14 except that the $SiO_2$ film formation process (S108) is added between the p-type silicon (Si) film formation process (S106) and the p+-type Si film formation process (S112) and the $SiO_2$ film formation process (S116) is added between the p+-type Si film formation process (S112) and the p-type Si film formation process (S118). Content other than content specifically described below is the same as in the third embodiment. First, the dielectric film formation process (S102) to the p-type silicon (Si) film formation process (S106) are the same as in FIGS. 1 and 14.

Figure 18A:
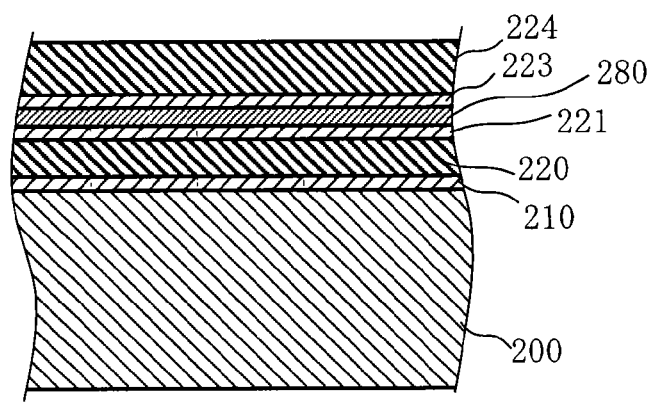
FIGS. 18A to 18C are process sectional views of the method for fabricating a semiconductor device according to the fourth embodiment.
Figure 18B:
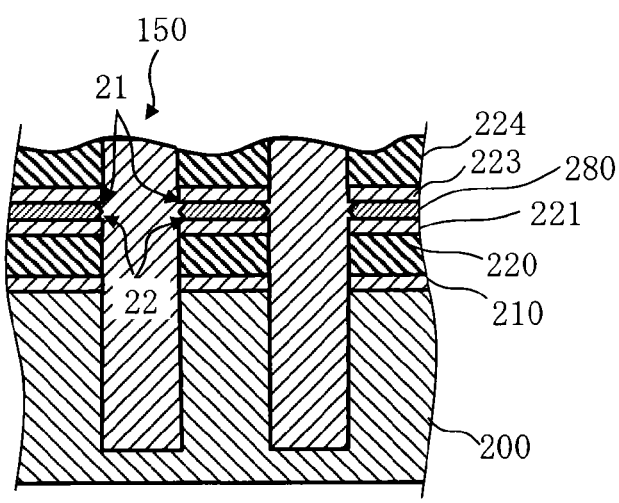
Figure 18C:
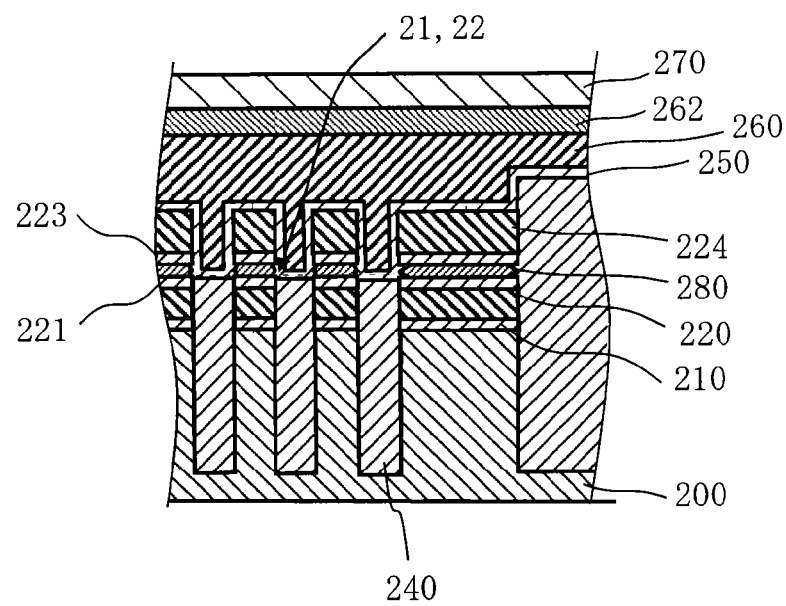

FIGS. 18A to 18C show process sectional views of the method for fabricating a semiconductor device according to the fourth embodiment. FIGS. 18A and 18B show the $SiO_2$ film formation process (S108) to the CG film formation process (S132) in FIG. 17.

In FIG. 18A, as the $SiO_2$ film formation process (S108), the $SiO_2$ film 221 (first oxide film) is formed on the p-type polysilicon film 220 by using, for example, the CVD method or the ALD method to a thickness of, for example, 1 nm or less.

Then, as the p+-type Si film formation process (S112), the p+-type polysilicon film 280 is formed on the $SiO_2$ film 221.

Next, as the $SiO_2$ film formation process (S116), the $SiO_2$ film 223 (second oxide film) is formed on the p+-type polysilicon film 280 by using, for example, the CVD method or the ALD method to a thickness of, for example, 1 nm or less.

Then, as the p-type Si film formation process (S118), the p-type polysilicon film 224 is formed on the $SiO_2$ film 223.

According to the above process, the p+-type polysilicon film 280 can be formed so as to be sandwiched via the $SiO_2$ films 221 and 223 (oxide film portions) without being directly sandwiched between the p-type polysilicon films 220 and 224. Accordingly, an effect of suppressing mixing of p-type impurities and p+-type impurities in a heating process before a recess is formed on the side face of a semiconductor film for FG can be expected. Also, electric conductivity in the FG film can be maintained by making the $SiO_2$ films 221 and 223 thinner. Therefore, the thickness of the $SiO_2$ films 221 and 223 may be set to a range in which electric conductivity in the FG film can be maintained.

Then, like in the third embodiment, as shown in FIG. 18B, 2-step recesses 21 and 22 having different heights can be formed on the side face of a FG film by executing the SiN film formation process (S119) to the heating process (S126). In the fourth embodiment, the p+-type polysilicon film 280 is sandwiched between the $SiO_2$ films 221 and 223. In such a case, accelerated oxidation in the heating process (S126) proceeds along the interface between the p+-type polysilicon film 280 and the $SiO_2$ film 221 and the interface between the p+-type polysilicon film 280 and the $SiO_2$ film 223 and thus, as shown in FIG. 18B, a plurality (here, for example, two steps) of the recesses 21 and 22 is formed from the side face toward the inner portion in the height position of the p+-type polysilicon film 280.

By executing the etch-back process (S128) to the CG film formation process (S132) like in the first embodiment, as shown in FIG. 18C, the height of the interface between the dielectric film 240 and the IPD dielectric film 250 can be aligned close to at least one of the 2-step recesses 21 and 22 having different heights for each space between memory devices.

Fifth Embodiment

In the first to fourth embodiments, a recess is formed on the side face of an FG film and an $SiO_2$ film is deposited in the recess to use the $SiO_2$ film in the recess to adjust the etching rate for etching back the dielectric film 240 for element isolation. However, the technique for adjusting the etching rate for etching back the dielectric film 240 for element isolation is not limited to the above example. In a fifth embodiment, a configuration using a conductive metal oxide film in place of an $SiO_2$ film will be described. The fifth embodiment will be described below by using the drawings.

Figure 19:
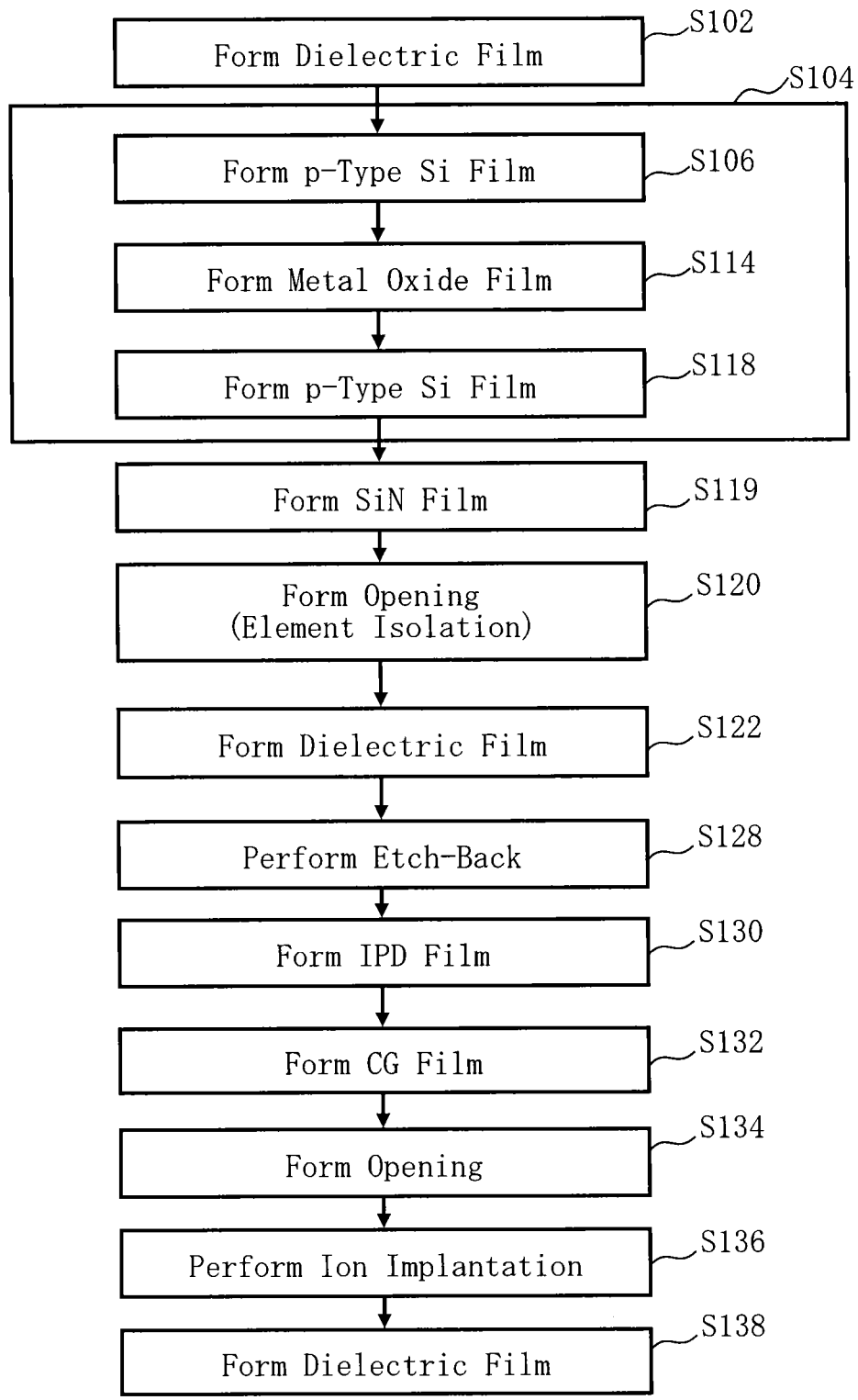
FIG. 19 is a flowchart showing principal part processes of the method for fabricating a semiconductor device according to a fifth embodiment.

FIG. 19 is a flowchart showing principal part processes of the method for fabricating a semiconductor device according to the fifth embodiment. FIG. 19 is the same as FIG. 1 except that a metal oxide film formation process (S114) is executed in place of the n+-type Si film formation process (S110). Content other than content specifically described below is the same as in the first embodiment. First, the dielectric film formation process (S102) to the p-type silicon (Si) film formation process (S106) are the same as in FIG. 1.

Figure 20A:
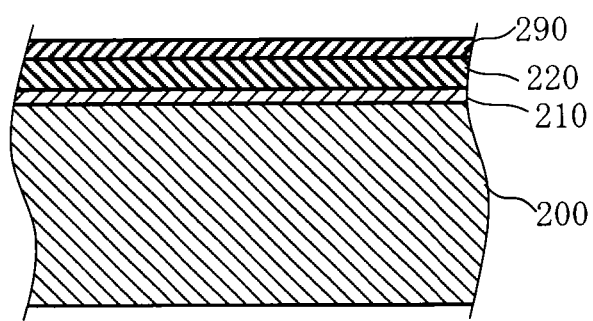
FIGS. 20A and 20B are process sectional views of the method for fabricating a semiconductor device according to the fifth embodiment.
Figure 20B:
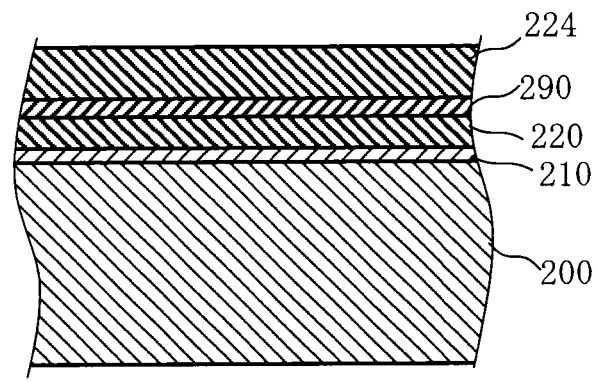

FIGS. 20A and 20B show process sectional views of the method for fabricating a semiconductor device according to the fifth embodiment. FIGS. 20A and 20B show the metal oxide film formation process (S114) to the p-type Si film formation process (S118) in FIG. 19. Subsequent processes will be described later.

In FIG. 20A, as the metal oxide film formation process (S114), a metal oxide film 290 (conductive oxide film portion) is formed on the p-type polysilicon film 220 by using, for example, the CVD method to a thickness of, for example, 5 nm. For example, an oxide film containing one of iridium (Ir), a compound of strontium (Sr) and ruthenium (Ru), and tin (Sn) is suitable as the metal oxide film 290. For example, an iridium oxide ($IrO_2$) film, strontium-ruthenium oxide (SRO) film, or tin oxide ($SnO_2$) film is suitably used.

In FIG. 20B, as the p-type Si film formation process (S118), the p-type polysilicon film 224 is formed on the metal oxide film 290.

Figure 21A:
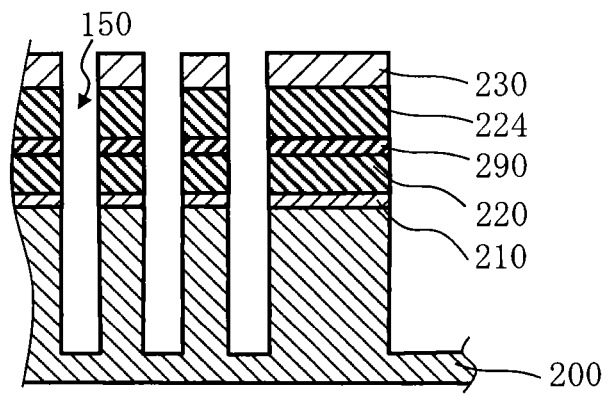
FIGS. 21A and 21B are process sectional views of the method for fabricating a semiconductor device according to the fifth embodiment.
Figure 21B:
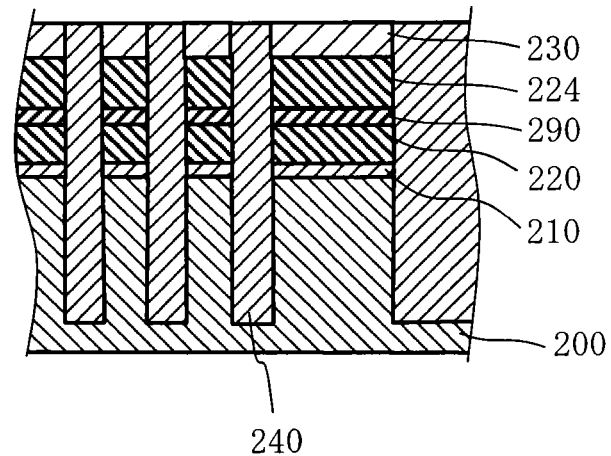

FIGS. 21A and 21B show process sectional views of the method for fabricating a semiconductor device according to the fifth embodiment. FIGS. 21A and 21B show the SiN film formation process (S119) to the dielectric film formation process (S122) in FIG. 19. Subsequent processes will be described later.

In FIG. 21A, like in the first embodiment, the SiN film formation process (S119) is first executed.

Next, as the opening formation process (S120), the opening 150 in a groove shape is formed from the SiN film 230 up to some midpoint of the semiconductor substrate 200. For example, the opening 150 of the width 20 nm or less is formed at intervals of 40 nm or less. The opening 150 can be formed substantially perpendicularly to the surface of the semiconductor substrate 200 by removing the exposed SiN film 230 and the polysilicon film 224, the metal oxide film 290, the polysilicon film 220, the dielectric film 210, and the semiconductor substrate 200 positioned as lower layers of the SiN film 230 by the anisotropic etching method from the semiconductor substrate 200 having a mask film formed on the SiN film 230 by undergoing a sidewall transfer processing process (not shown). For example, the opening 150 may be formed, as an example, by the reactive ion etching (RIE) method. The opening 150 formed as described above becomes an element isolation region.

When the opening 150 is formed, etching is performed by using a halogen containing gas without any additional gas as an etching gas in the first embodiment, but the etching gas is not limited to such an example in the fifth embodiment because the n+-type polysilicon film 222 is not formed. A halogen containing gas to which an additional gas such as $N_2$ or $O_2$ is added may be used to perform etching. Incidentally, a $CF_4$ gas, $C_4F_8$ gas, $CHF_3$ gas, or $CH_2F_2$ gas is suitably used as the halogen containing gas. In the fifth embodiment, as shown in FIG. 21A, no recess is formed on the side face of an FG film in the stage of the opening formation process (S120).

In FIG. 21B, as the dielectric film formation process (S122), the dielectric film 240 (second dielectric film) is formed in the opening 150 so as to bury the opening 150 and on the SiN film 230 by using, for example, the CVD method or the coating process.

Then, as a planarization process, the dielectric film 240 bulging out of the opening 150 and the dielectric film 240 on the SiN film 230 are polished and removed by the CMP method for planarization using the SiN film 230 as a stopper. Accordingly, as shown in FIG. 21B, element isolation between memory cells can be realized.

Figure 22A:
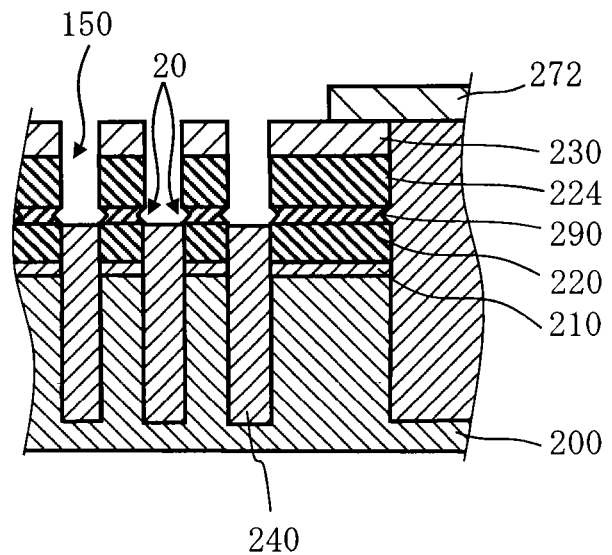
FIGS. 22A and 22B are process sectional views of the method for fabricating a semiconductor device according to the fifth embodiment.
Figure 22B:
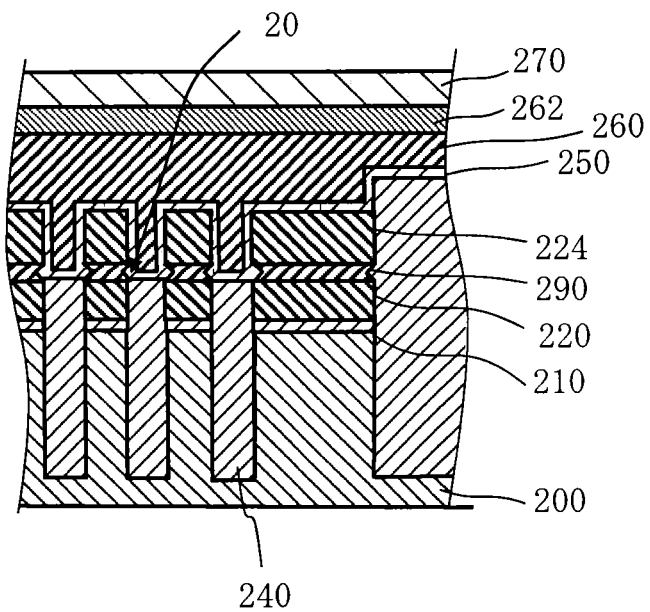

FIGS. 22A and 22B show process sectional views of the method for fabricating a semiconductor device according to the fifth embodiment. FIGS. 22A and 22B show the etch-back process (S128) to the CG film formation process (S132) in FIG. 19.

In FIG. 22A, when the etch-back surface reaches the height position of the metal oxide film 290 by executing the etch-back process (S128), an etching gas is also consumed for the metal oxide film 290 so that a phenomenon in which the etching rate in the thickness direction (height direction) is significantly decreased occurs. Accordingly, the recess 20 cutting into the inner portion from the side face is formed on the side face of the metal oxide film 290. As a result, like in the first embodiment, adjustments are made in a way in which an etching surface that has reached the height position of the metal oxide film 290 waits for another etching surface of the opening 150 that has not reached the height position of the metal oxide film 290. Thus, the width of the distribution of digging height is significantly reduced. As a result, as shown in FIG. 22A, a uniform and flat etching surface can be realized by such adjustments.

By executing the IPD film formation process (S130) and the CG film formation process (S132) like in the first embodiment, as shown in FIG. 22B, the height of the interface between the dielectric film 240 and the IPD dielectric film 250 can be aligned close to the height of the recess 20 for each space between memory devices.

In the foregoing, embodiments have been described with reference to concrete examples. However, the embodiments are not limited to the concrete examples. In the first embodiment described above, for example, if the coating process is used when the dielectric film 240 for element isolation is formed, a liner film of $SiO_2$ may be formed on the sidewall of an FG film by the CVD method or the ALD method. The liner film can prevent impurities in a coated film from diffusing into the FG film.

In addition, all semiconductor devices and all methods for fabricating a semiconductor device that include elements of the embodiments and whose design can be changed as appropriate by persons skilled in the art are included in the scope of the embodiments.

While techniques normally used in the semiconductor industry such as cleaning before and after treatment are not described for convenience of description, it is needless to say that such techniques are included in the scope of the embodiments.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first dielectric film formed above a semiconductor substrate;
a floating gate portion formed above the first dielectric film, a recess cutting into an inner portion of a side face of the floating gate portion being formed on the side face of the floating gate portion, the floating gate portion including first semiconductor films and a second semiconductor film arranged between the first semiconductor films, the second semiconductor film having different etching selectivity from that of the first semiconductor films, the recess being formed in a side face of the second semiconductor film and not being formed in side faces of the first semiconductor films;
a second dielectric film for element isolation of semiconductor elements arranged on a side of the side face of the floating gate portion and embedded between a height position of a lower portion of the side face of the floating gate portion and a height position inside the semiconductor substrate, the second dielectric film covering a greater part of a side face of a first semiconductor film of a lower side of the first semiconductor films;
a third dielectric film formed to cover an upper surface of the floating gate portion and a side face portion of the floating gate portion up to a height position of an upper surface of the second dielectric film, of the side face of the floating gate portion continuing from the upper surface of the floating gate portion, and also on the second dielectric film; and
a control gate portion formed above the third dielectric film,
wherein a height position of an interface between the second dielectric film and the third dielectric film is provided between a height position in the recess and a position in a predetermined range below the height position in the recess.

2. The device according to claim 1, wherein
the floating gate portion includes a conductive oxide film portion, and
the recess is formed in a height position of the conductive oxide film portion.

3. The device according to claim 2, wherein a metal oxide film is used as the conductive oxide film portion.

4. The device according to claim 3, wherein an oxide film containing one of iridium (Ir), a compound of strontium (Sr) and ruthenium (Ru), and tin (Sn) is used as the metal oxide film.

5. The device according to claim 1, wherein a plurality of recesses cutting into the inner portion from the side face and having different height positions are formed in the floating gate portion.

6. The device according to claim 5, wherein the floating gate portion has oxide film portions formed inside the floating gate portion and formed above and below the plurality of recesses.

7. The device according to claim 6, wherein the oxide film portions have a thickness of 1 nm or less.

8. The device according to claim 1, wherein a p-type silicon film is used as the floating gate portion.

9. The device according to claim 1, wherein the third dielectric film is an inter-electrode dielectric film.

* * * * *